(12) United States Patent
Graindorge et al.

(10) Patent No.: US 6,507,597 B1
(45) Date of Patent: Jan. 14, 2003

(54) MULTIWAVELENGTH SOURCE

(75) Inventors: Philippe Graindorge, Sauveur (FR); Philippe Martin, Ponchartrain (FR); Bernard Laloux, Villepreux (FR); Hervé Lefevre, Paris (FR)

(73) Assignee: Photonetics, Marly le Roi (FR)

( * ) Notice: Subject to any disclaimer, the term of this patent is extended or adjusted under 35 U.S.C. 154(b) by 0 days.

(21) Appl. No.: 09/453,410

(22) Filed: Dec. 3, 1999

(30) Foreign Application Priority Data

Dec. 4, 1998 (FR) .............................. 98 15367

(51) Int. Cl.$^7$ ................................. H01S 3/08
(52) U.S. Cl. ...................... 372/102; 372/20; 372/23; 372/96; 372/97
(58) Field of Search .................. 372/20, 102, 96, 372/97, 23, 92

(56) References Cited

U.S. PATENT DOCUMENTS 5,594,744 A * 1/1997 Lefevre et al. ............... 372/20

FOREIGN PATENT DOCUMENTS

| EP | 702438 | 3/1996 |
| GB | 2202404 | 9/1988 |

OTHER PUBLICATIONS

Poguntke, K.R. et al.: "Design of a Multistripe Array Grating Integrated Cavity (MAGIC) Laser", Journal of Lightwave Technology, pp. 2191–2200, Dec. 1993.

Patent Abstract of Japan, vol. 005, No. 163 of Japanese Application No. 56090642.

Nyairo, K.O. et al.: "Multiple Channel Signal Generation Using Multichannel Grating Cavity Laser with Crosstalk Compensation", Electronics Letters, pp. 261–263, Jan. 30, 1992.

* cited by examiner

*Primary Examiner*—James Davie
(74) *Attorney, Agent, or Firm*—Arent Fox Kintner Plotkin & Khan, PLLC

(57) ABSTRACT

Multiwavelength laser source transmitting a luminous flux including as many amplifier wave-guides as potential transmission wavelengths, a collimation optic system for collimating the beams transmitted by the wave-guides, a network and a retroreflector making up the network, a dispersive retroreflecting device that defines with each wave-guide, an external resonating cavity, whereas each wave-guide has an inner face and an outer face with respect to its associated cavity. A Fabry-Perot interferometer with reduced fine adjustment is placed in the cavity between the collimation optic system and the network, whereby the interferometer is tilted with respect to the axis of the cavity and forms a little selective filter, whose variation law of the wavelength transmitted in relation to the angle of incidence is identical with that of the dispersive retroreflecting device.

26 Claims, 5 Drawing Sheets

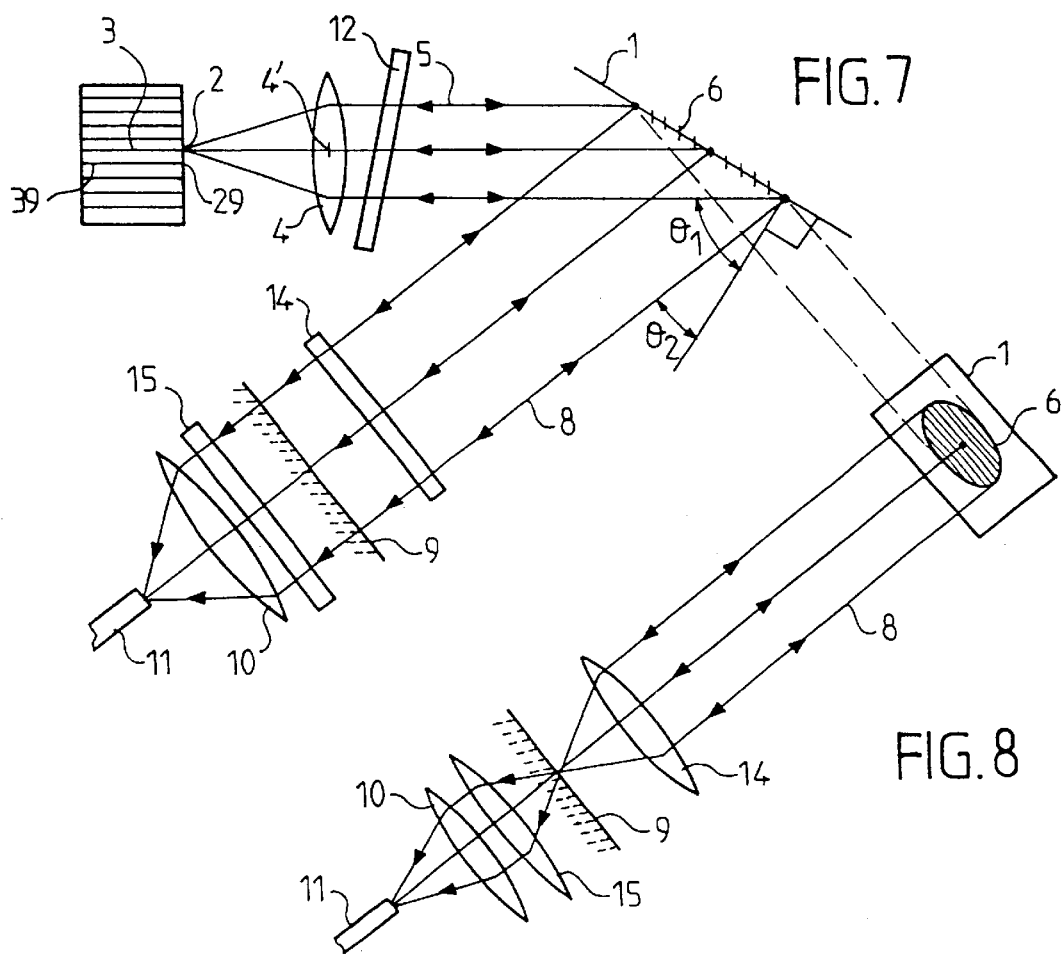

MULTIWAVELENGTH SOURCE

FIELD OF THE INVENTION

The development of optical telecommunications has demonstrated the advantage of implementing wavelength-multiplexed transmissions. Thus, different luminous fluxes, each able to carry a different content of information, must transit over the same wave-guide, for example over the same optical fiber. The transmission capacities of the same hardware means, composed essentially of the optic fiber are thus enhanced considerably.

BACKGROUND OF THE INVENTION

Until now, to provide this multiplexing, several sources have been used generally, each transmitting at a certain wavelength that is unique. Their coupling is ensured in a unique fiber via a multiplexer. This arrangement is often satisfactory. However, this arrangement involves multiplying the number of sources and hence of each of their components and resorting to a multiplexer that collects the luminous fluxes transmitted by the different sources and coupling them to a given fiber.

A system of optical communications has been suggested (Patent Abstract of Japan—JP-A-56.090,642) comprising several solid-state lasers associated with a unique retroreflecting device. This retroreflecting device "sees" each of these lasers from a different angle and forms with the same angle a different cavity. Each source thus formed transmits at a unique wavelength. This arrangement enables, with respect to completely disconnected systems, limiting the number of necessary components, but calls for the use of a multiplexer in order to couple the fluxes transmitted by these sources in a fiber.

From GB-A-2.202.404 patent application, a device supplying a multiwavelength laser source is known, ensuring coupling the various transmission wavelengths in a unique output fiber. This device comprises lasers associated with an external cavity enabling each of them to resonate at a different wavelength and coupling the fluxes generated in an optic fiber.

This document GB-2.202.404 indicates that the laser, as any external cavity laser, even single wave-guide external cavity laser, may resonate over several longitudinal modes. Conventionally, it is suggested to obviate this drawback by using a reference structure. This structure is formed in the output fiber, i.e. in a zone where the beams are superimposed spatially.

However, in a multiwave-guide external cavity source, in addition of, or instead of the wavelengths desired, interference wavelengths may be generated. This may result that, in addition to the selection provided by the cavities that correspond to a determined wave guide to a single two-way travel of the beam between this wave-guide and the external reflector, such a device also forms cavities corresponding to several two-way travels of the beam between several amplifier guides and the external reflector. In a particular laser, the amplifier medium is thus capable of resonating at several wavelengths accepted by the external cavity. Such a conflict between modes is obviously detrimental and prevents the source from operating correctly.

One aim of the invention is to provide a multiwavelength source that does not exhibit these defects and whose operation is, generally, optimized.

SUMMARY OF THE INVENTION

To this end, the inventive relates to a multiwavelength laser source transmitting a luminous flux comprising as many amplifier wave-guides as potential transmission wavelengths, a collimation optic system for collimating the beams transmitted by the wave-guides, a network and a retroreflective making up with the network, a dispersive retroreflecting device that defines with each wave-guide an external resonating cavity, whereby each wave-guide has an inner face and an outer face with respect to its associated cavity.

According to the invention, a Fabry-Perot interferometer where reduced fine adjustment is placed in the cavity between the collimation optic system and the grating, whereby the said interferometer is tilted with respect to the axis of the cavity and forms a little selective filter, whose variation law of the wavelength transmitted in relation to the angle of incidence is identical with that of the dispersive retroreflecting device.

According to various embodiments, each exhibit particular and unable advantages in all technically possible combinations:

- the resonating external cavity is in the Littman-Metcalf configuration;
- the luminous flux transmitted is collected via the retroreflector and coupled in a single output monomode fibre;
- the retroreflector is a mirror;
- the retroreflector is a self-aligned system;
- the retroreflector is a dihedron;
- the retroreflector comprises a cylindrical lens and a partially retroreflecting mirror;
- a prism arranged between the grating and the collimation optic system provides linear distribution of the frequencies of the luminous fluxes generated by the source;
- the amplifier wave-guides are identical with one another;
- the wave-guides are made over the same solid state substrate;
- the inner face of each wave-guide has an anti-reflecting coating;
- the outer face of the wave-guides is 100% reflecting.

BRIEF DESCRIPTION OF THE DRAWINGS

The invention will be described in detail below with reference to the appended Figures on which:

FIG. 7 is a top view of the multiwavelength source of the invention, in a second embodiment.

FIG. 8 is a side view of the source in its second embodiment.

DETAILED DESCRIPTION OF THE PREFERRED EMBODIMENT

Figure 1:
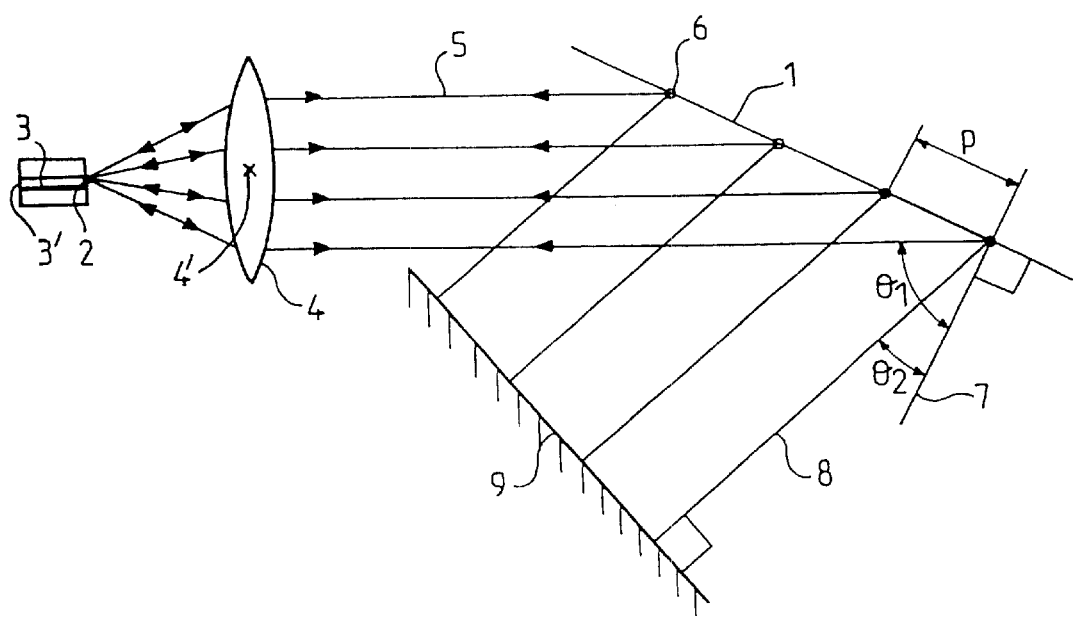
FIG. 1 is a representation of the prior art used to show the Littman-Metcalf configuration.

FIG. 1 is a representation of a known Littman-Metcalf assembly in which a grating 1 is implemented with a guided amplifier medium 3 comprising an external end 3' and whose internal end 2 is placed in the focus of a collimation system 4 that produces a collimated beam 5.

This beam is parallel to the dispersion plane of the grating, i.e. to the plane perpendicular to the line 6 of the network 1 and forms an angle $\theta_1$ with the normal line 7 at the surface of the grating 1. Using chromatic dispersion created by diffraction over the grating, the beam 5 generates a secondary collimated beam 8 that is located in the dispersion plane and forms an angle $\theta_2$ with the normal line 7. A plane mirror 9 is place conventionally perpendicular to the beam 8 and the beam is reflected through the whole system.

We know under these conditions that p being the pitch of the grating when the relation $$P \sin \theta_1 + p \sin \theta_2 = \lambda$$

is verified, where $\theta_1$ is the angle of incidence of the luminous beam (whose direction is defined by the center of the inner face 2 of the guide 3 and the center 4' of the collimation optic system 4) on the grating and where $\theta_2$ is the angle of diffraction that corresponds to a direction perpendicular to the mirror 9, the beam 5 at the wavelength $\lambda$ comes back to its starting point after a first diffraction onto the grating 1 retroreflection onto the mirror 9 and a second diffraction onto the grating 1. It generates therefore an image point merging with the internal end 2 of the guided amplifier medium 3. The light is re-coupled in the guided amplifier and enables laser transmission at the wavelength $\lambda$.

This device has been used for the production of luminous sources transmitting over a narrow wavelength band and it has also been suggested to provide arrangements enabling varying this narrow wavelength band (patent EP-A-0.702.438).

Figure 3:
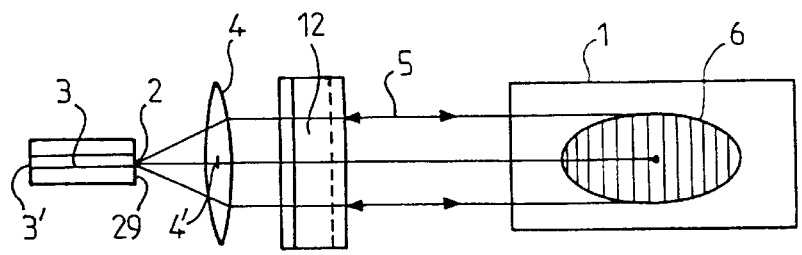
FIG. 3 is a front view of this same source.
Figure 2:
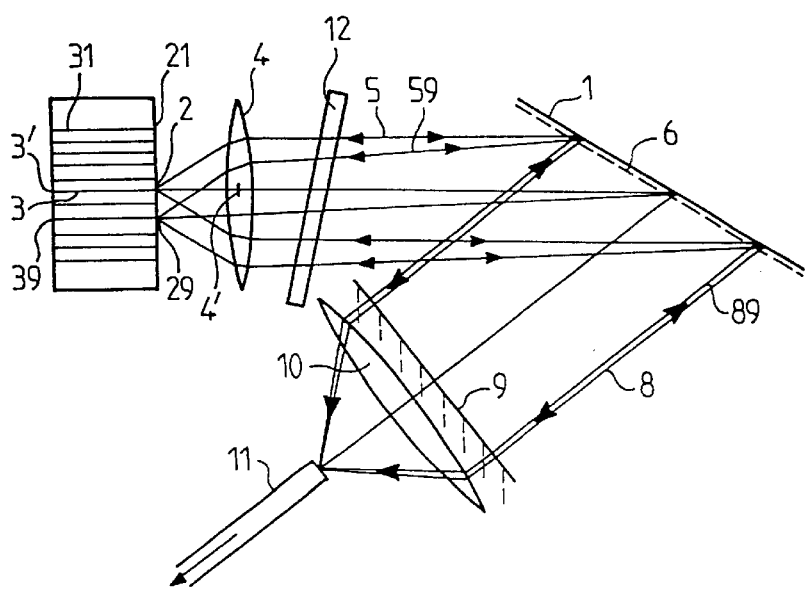
FIG. 2 is a top view of the multiwavelength source according to the invention, in a first embodiment.
Figure 4:
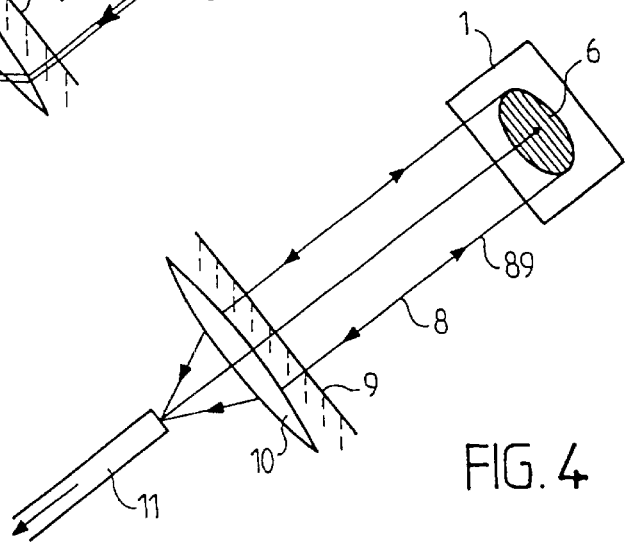
FIG. 4 is a side view of this same source.

FIGS. 2 to 4 represent the device of the invention in an embodiment implementing fundamental principles of the Littman-Metcalf configuration described above. The elements corresponding to those already described are designated by the reference numbers used previously. In this device, several amplifier wave-guides with outer faces 3', 31', . . . 39' have their inner faces 2, 21, 22, . . . 29 located in the focal plane F of the optic system 4, thus, each of these amplifier wave-guides 3, 31, . . . 39' have their inner faces 2, 21, 22, . . . , 29 located in the focal plane F of the optic system 4. Thus, each of these amplifier wave-guides 3, 31, . . . , 39 defines a particular angle $\theta_1$, $\theta_{11}$, . . . , $\theta_{19}$ of incidence onto the grating. Conversely, the retroreflecting device 9 being unique, the angle $\theta_2$, which corresponds to the orthogonal incidence onto the retroreflector, remains constant whatever the amplifier wave-guide 3, 31, . . . , 39 considered.

This description will be further explained while considering solely the amplifier wave-guides 3 and 39. It appears that the behaviour generated by the amplifier wave-guides 31, . . . , 38 is similar to that of the amplifier wave-guide 39.

Thus, as regards the wavelength $\lambda_i = \lambda_9$, the beam 59 transmitted by the wave-guide 39 is received by the grating 1 under an angle of incidence $\theta_{1i} = \theta_{19}$ and dispersed under the angle $\theta_2$ in the form of a beam 89.

The amplifier wave-guide 39 defines therefore an angle $\theta_{19}$ different from $\theta_1$, the wavelength $\lambda_9$ is selected by the cavity 9-39' formed by the external end 39' of this amplifier wave-guide 39 and the retroreflecting system 9 and therefore the wavelength $\lambda_9$ meets the condition $\lambda_9 = p \sin \theta_{19} + p \sin \theta_2$.

The retroreflecting system 9 is partially retroreflecting so that a portion of the luminous flux resonating in the cavities 9-3' and 9-39' is extracted by this partially reflecting system 9. Since all the resonating beams are perpendicular to the mirror 9 in the cavity, they remain parallel to one another at output and they can be coupled in the same monomode optic fiber 11 with an optic system 10.

It should be noticed indeed that the amplifier wave-guide 39 forms with the partially reflecting system 9, a resonating cavity that selects, in the transmission spectrum of the amplifier wave-guide 39, the wavelength $\lambda_9$ and that the luminous fluxes having the respective wavelengths $\lambda$ and $\lambda_9$ are superimposed in the portion of the cavity enclosed between the grating 1 and the partially reflecting system 9 and that they are therefore transmitted via the partially reflecting system 9 and that they are therefore transmitted via the partially retroreflecting system 9, along the same direction. The coupling optic system 10 therefore enable simultaneous coupling in the monomode fiber 11 of the luminous flux at the wavelength $\lambda$ and the luminous flux at the wavelength $\lambda_9$.

Each of the amplifier media 3, 31, . . . or 39 whose inner end is placed in the focal plane of the collimation optic system 4, forms a cavity 9-3', 9-31', or 9-39' and generates a luminous flux processed similarly and is therefore coupled in the output fiber 11.

The amplifier media 3, 31, . . . , 39 are advantageously solid-state amplifiers such as diodes. Application of an electric control signal enables, while modulating the power of each of these diodes independently, i.e. each of the channels transmitted by the fiber, to send the corresponding content of information to the various electric control signals.

It has been noticed that apart from the resonating cavity formed for example by the amplifier wave-guide 39 with the partially reflecting system 9, it is also possible to obtain resonating cavities using the amplifier wave-guide 39 by reflection onto the partially reflecting system 9, then by re-coupling in a second wave-guide, for example the wave-guide 31, then an additional reflection onto the partially reflecting system 9 and finally return to the amplifier wave-guide 39.

This double resonating cavity is therefore capable of producing interference effects liable, under certain conditions, to disturb or even dominate those produced by the first main cavity, that which selects in the transmission spectrum of the amplifier wave-guide 39, the wavelength $\lambda_1 = \lambda_9$. Transmission at this wavelength $\lambda_1 = \lambda_9$ is then disturbed, which is obviously detrimental to the operation of the source.

These interferences can be avoided by providing additional filtering avoiding laser transmission involving several amplifier guides.

Indeed, the wavelength selection law in simple cavities 9-3i' (i=1 to 9) is as we have seen:

$$\lambda_i = p \sin\theta_{1i} + p \sin\theta_2$$

where i=1 to 9.

For its own part, a Fabry-Perot interferometer also shows an angular dependency on the wavelength transmitted $\lambda_t$ $$\lambda_t = \lambda_n \cos\theta_{FPi}$$

where $\lambda_n$ is the wavelength transmitted at the normal incidence and $\theta_{FPi}$ is the angle between the normal line in relation to the Fabry-Perot interferometer and the direction of the beam i.

It has been found that it is possible to select the tilting of the Fabry-Perot interferometer so that both variation laws are identical.

In the case of the Littrow configuration that could be implemented, in the scope of the invention, instead of the Littman-Metcalf configuration to which it has been referred until now, where $\lambda_i 2 \, p \sin \theta_{1i}$, it suffices that the Fabry-Perot interferometer is perpendicular to the grating with $\lambda_n = 2\, p$, then $\theta_{1i} = 90° - \theta_{Fpi}$ and $\sin \theta_{1i} = \cos \theta_{Fpi}$.

Figure 5:
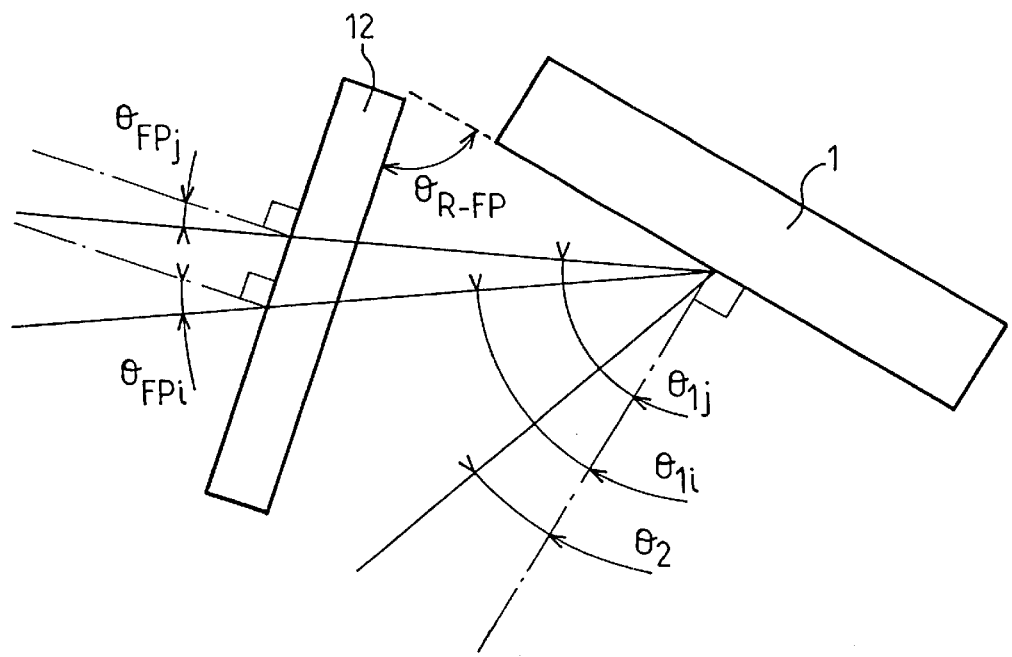
FIG. 5 illustrates the angles of incidence of the central radii of the beams onto the grating and onto the Fabry-Perot interferometer.

In the case of a Littman-Metcalf configuration described at FIG. 5, the law is more complex but it suffices to equalize the angular dispersions, i.e. the derivates of the grating law and of the Fabry-Perot law. For information purposes, good results have been obtained for an average incident angle $\theta_{Fpi}$ (angle of incidence of the beam onto the Fabry-Perot interferometer) in the order of 8° and an average angle of incidence onto the grating in the order of 75°. We therefore obtain and angle of $\theta_{R-FP}$ formed by the plan of the grating with that of the Fabry-Perot interferometer in the order of 83°.

The Fabry-Perot interferometer is then transparent for the different simple cavities operating with a wavelength $\lambda_i$, an incidence $\theta_{1i}$ onto the grating and $\theta_{Fpi}$ onto the Fabry-Perot interferometer.

Now, double cavity operation between the guides $3i$ and $3j$ always leads to incidences $\theta_{1i}$, $\theta_{1j}$ onto the grating and $\theta_{Fpi}$, $\theta_{Fpj}$ onto the Fabry-Perot interferometer. However, the transmission wavelength would then be $(\lambda_i + \lambda_j)/2$ and as this wavelength is attenuated by the Fabry-Perot interferometer at the incidences $\theta_{Fpi}$, $\theta_{Fpj}$, there cannot be any laser effect for this double cavity.

The wavelength $(\lambda_i + \lambda_j)/2$ being practically at a distance from $\lambda_i$ and $\lambda_j$ and a double cavity leading to four passages in the Fabry-Perot interferometer, it is sufficient to have a little adjustment facility in order to suppress the laser effect on the double cavities.

According to the invention, it has been noticed that it is thus possible to carry out for a single component, the necessary filtering over all the transmission wavelengths.

This means consists of a Fabry-Perot interferometer 12, placed between the collimation optic system 4 and the grating 1, where the incidences of the various beams differ from one another and this means is tilted with respect to the average axis of the cavity.

Figure 6:
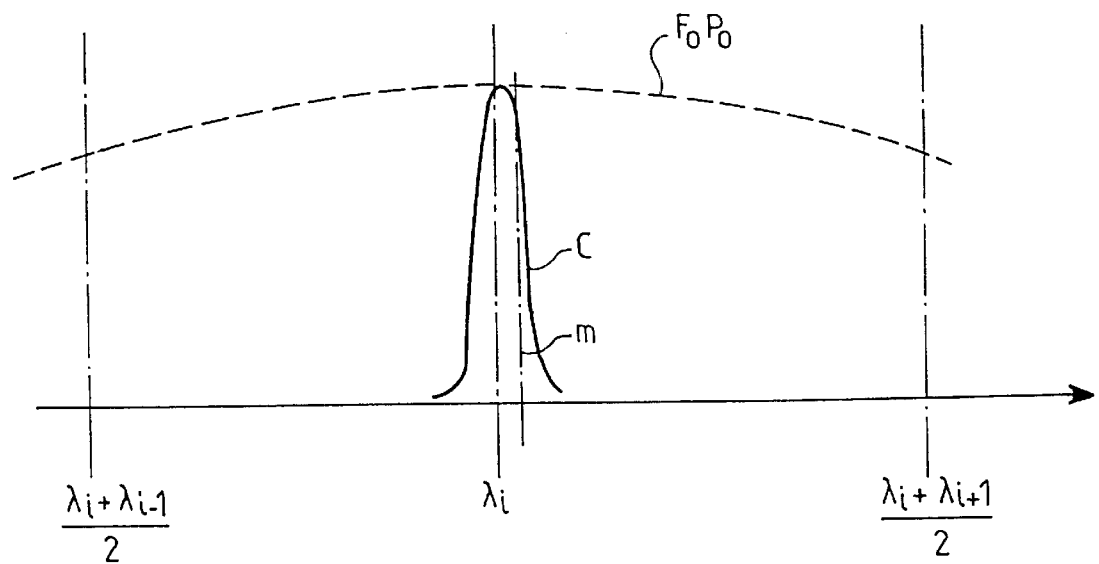
FIG. 6 is a view of the wavelength selection carried out, on the one hand, by the external cavity in the absence of Fabry-Perot interferometer, and on the other hand, by the Fabry-Perot interferometer placed in this cavity.

FIG. 6 represents in semi-dotted line m the wavelengths of the longitudinal modes liable to be accepted by an external cavity,. As a continuous line c the filtering function of the grating and as a dotted line $F_0P_0$ the pass-band of the Fabry-Perot interferometer 12. The simple external cavity therefore transmits at the wavelength $\lambda_i$ which corresponds t the minimal attenuation of the grating.

The potential transmission at the wavelengths $(\lambda_i + \lambda_{i-1})/2$ and $(\lambda_i + \lambda_{i+1})/2$ that should be eliminated by the Fabry-Perot interferometer 12, are quite offset with respect to the wavelength $\lambda_i$ whose transmission is desired, it is not necessary for the Fabry-Perot interferometer to be very selective and a low selectivity Fabry-Perot interferometer, i.e. whose faces have relatively low reflection coefficient, provides the best result.

For example, a 5–10 fine adjustment for a 30 nm free spectral interval is quite acceptable.

In such a system, the modulation frequency of the luminous flux generated by the electric control signal cannot exceed the mode-lock frequency that depends on the optic length of the cavity and the height of this frequency is inversely proportional to the optic length of the cavity.

According to the invention, it is possible to make a cavity with length in the order of 15 mm, which defines a lock frequency in the order of 10 GHz and enables a modulation that may reach 2.5 GHz frequency.

As the luminous flux is extracted by the partially reflecting system 9, the outer faces 3', 31', ..., 39' of the amplifier media are advantageously entirely reflecting.

In a preferred embodiment represented on FIGS. 7 and 8, the stability of the system and its adjustment are facilitated by the use of a cylindrical lens 14 that makes the beam, as seen laterally, converge along a direction perpendicular to the dispersion plane of the grating, whereas they do not affect the beam in a parallel direction. The cylindrical lens 14 is placed before the semi-reflecting mirror 9 which contains its focus line and a cylindrical lens 15 placed after the semi-reflecting mirror 9 brings the beam back to the parallel axis which is then coupled by the optic system 10 in the output fiber 11.

The various amplifier wave-guides are advantageously identical with or similar to one another, made on the same solid-state substrate and can transmit in the spectral bands generally used for optic telecommunications, for example between 1530 nm and 1565 nm. The wavelengths or frequencies selected depend on the focal of the optic system 4, on the pitch of the grating 1, on the spacing between the cores of the amplifier wave-guides 3, 31, ..., 39 and on the orientation of the grating and the retroreflector.

Figure 9:
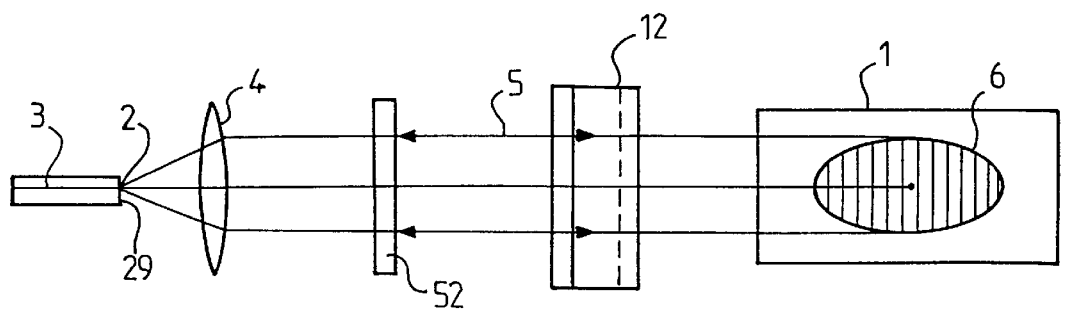
FIG. 9 is a partial front view showing schematically a frequency linearisation prism.
Figure 10:
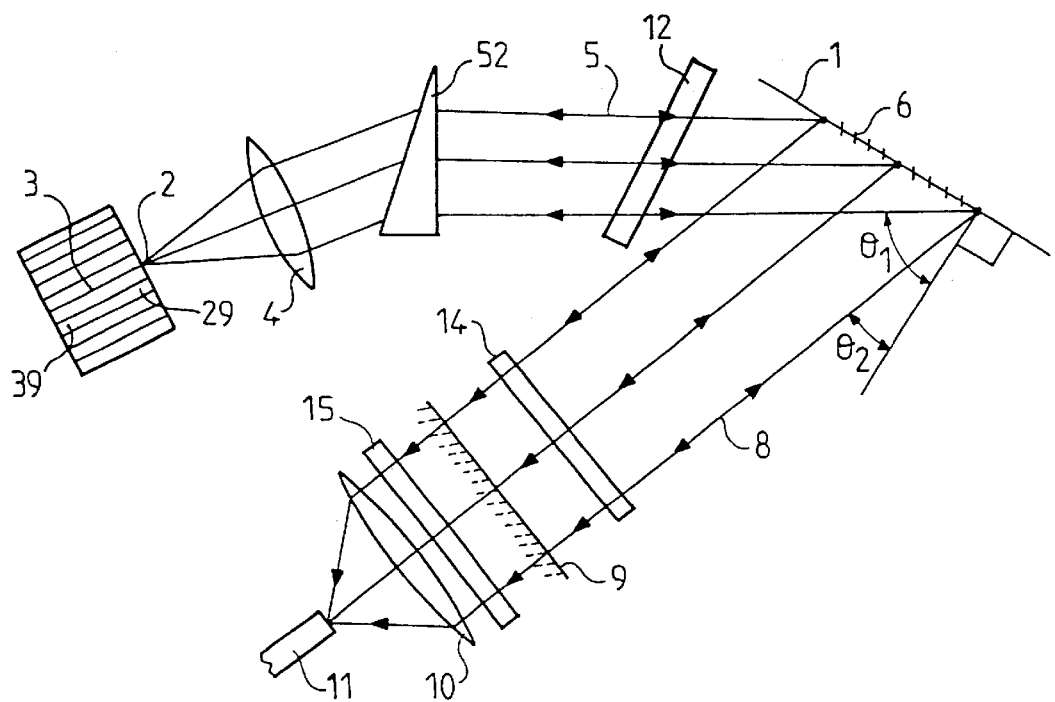
FIG. 10 is a top view showing the source provided with a frequency linearization prism.

The relation, specified at the beginning of this description, existing between the angles of incidence and of reflection onto the grating and the wavelength, outlines that equal spacing between the cores of the wave-guides leads to non-liner distribution of the frequencies. As described in FIGS. 9 and 10, a prism 52, placed in the upstream portion, i.e. between the collimation lens 4 and the grating 1 (preferably between the collimation optic system 4 and the Fabry-Perot interferometer 12), generates an anamorphosis effect which increases dispersion and selectivity and, by refraction effect, gives a non-linearity which compensates for the non-linearity of the laws of angular selection of the grating and of the Fabry-Perot interferometer. When the equidistant distribution of the frequencies is requested, such an arrangement is advantageously used.

Wavelength multiplexing is also used to increase the pumping power of an optic amplifier. Such a multiwavelength source could be used for this application, especially around 980 nm or around 1480 nm for pumping with erbium-doped fiber amplifiers.

What we claim is:

1. A multiwavelength laser source transmitting a luminous flux comprising:

as many amplifier wave-guides as potential transmission wavelengths;

a collimation optic system for collimating the beams transmitted by the wave-guides;

a diffraction grating and a retro-reflector;

a dispersive retro-reflecting device composed of the grating and the retro-reflector that defines with each wave-guide an external resonating cavity, wherein each wave-guide has an inner face and on outer face with respect to its associated cavity, and wherein a Fabry-Perot interferometer with reduced fine adjustment is placed in the cavity between the collimation optic system and the grating, whereby said interferometer is tilted with respect to the axis of the cavity and forms a selective filter, whose variation law of the wavelength transmitted in relation to the angle of incidence is identical with that of the dispersive retro-reflecting device.

2. A source according to claim 1, wherein the resonating external cavity is in the Littman-Metcalf configuration.

3. A source according to claim 2, wherein the luminous flux transmitted is collected via the partially transparent retroreflector and coupled in a single output monomode fiber.

4. A source according to claim 2, wherein the retroreflector is a mirror.

5. A source according to claim 2, wherein the retroreflector is a self-aligned system.

6. A source according to claim 5, wherein the retroreflector is a dihedron.

7. A source according to claim 5, wherein the retroreflector comprises a cylindrical lens and a partially reflecting mirror.

8. A source according to claim 1, wherein a prism arranged between the network and the collimation optic system provides linear distribution of the frequencies of the luminous fluxes generated by the source.

9. A source according to claim 1, wherein the amplifier wave-guides are identical with one another.

10. A source according to claim 1, wherein the wave-guides are made over the same solid state substrate.

11. A source according to claim 1, wherein the inner face of each wave-guide has an anti-reflecting coating.

12. A source according to claim 1, wherein the outer face of the wave-guides is 100% reflecting.

13. A multiwavelength laser source transmitting a luminous flux comprising:
   amplifier wave-guides corresponding in number to the number to the number of wavelengths;
   a collimation optic system for collimating the beams transmitted by the wave-guides;
   a dispersive retroreflecting device defining with each wave-guide an external resonating cavity, said retroreflecting device comprising a grating and a retroreflector;
   each waveguide having an inner face and an outer face with respect to its associated cavity;
   an interferometer placed in the cavity between the collimation optic system and the grating said interferometer being tilted with respect to the axis of the cavity and forming a selective filter, whose variation law of the wavelength transmitted in relation to the angle of incidence is identical with that of the dispersive retroreflecting device.

14. The laser source according to claim 13, wherein the interferometer comprises a Fabry-Perot interferometer.

15. The laser source according to claim 14, wherein the resonating external cavity is in the Littman-Metcalf configuration.

16. The laser source according to claim 15, wherein the luminous flux transmitted is collected via the partially transparent retroreflector and coupled in a single output monomode fiber.

17. The laser source according to claim 15, wherein the retroreflector is a mirror.

18. The laser source according to claim 15, wherein the retroreflector is a self-aligned system.

19. The laser source according to claim 18, wherein the retroreflector is a dihedron.

20. The laser source according to claim 18, wherein the retroreflector comprises a cylindrical lens and a partially reflecting mirror.

21. The laser source according to claim 13, wherein a prism arranged between the grating and the collimation optic system provides linear distribution of the frequencies of the luminous fluxes generated by the source.

22. The laser source according to claim 13, wherein the amplifier wave-guides are identical.

23. The laser source according to claim 13, wherein the wave-guides are made over the same solid state substrate.

24. The laser source according to claim 13, wherein an inner face of each wave-guide has an anti-reflecting coating.

25. The laser source according to claim 13, wherein an outer face of the wave-guides is 100% reflecting.

26. The laser source according to claim 14, wherein the Fabry-Perot interferometer has a reduced fine adjustment.

* * * * *